(12) United States Patent
Lill et al.

(10) Patent No.: US 9,431,268 B2
(45) Date of Patent: Aug. 30, 2016

(54) ISOTROPIC ATOMIC LAYER ETCH FOR SILICON AND GERMANIUM OXIDES

(71) Applicant: Lam Research Corporation, Fremont, CA (US)

(72) Inventors: Thorsten Lill, Santa Clara, CA (US); Ivan L. Berry, III, San Jose, CA (US); Meihua Shen, Fremont, CA (US); Alan M. Schoepp, Ben Lomond, CA (US); David J. Hemker, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/589,610

(22) Filed: Jan. 5, 2015

(65) Prior Publication Data

US 2016/0196984 A1    Jul. 7, 2016

(51) Int. Cl.
*H01L 21/302* (2006.01)
*H01L 21/311* (2006.01)
(Continued)

(52) U.S. Cl.
CPC ........ *H01L 21/31116* (2013.01); *C23C 16/458* (2013.01); *C23C 16/50* (2013.01); *C23C 16/52* (2013.01); *H01J 37/32009* (2013.01); *H01J 37/32449* (2013.01); *H01J 37/32715* (2013.01)

(58) Field of Classification Search
CPC .................. H01L 21/31116; H01J 37/32009; H01J 37/32449; H01J 37/32715; C23C 16/52; C23C 16/50
USPC ............................... 438/690–694; 216/37, 67
See application file for complete search history.

(56) References Cited

U.S. PATENT DOCUMENTS

| 4,313,782 A | 2/1982 | Sokoloski |
| 4,414,069 A | 11/1983 | Cuomo |

(Continued)

FOREIGN PATENT DOCUMENTS

| EP | 298879 | 1/1989 |
| JP | 74049461 | 11/1974 |

(Continued)

OTHER PUBLICATIONS

U.S. Appl. No. 12/002,171, filed Dec. 14, 2007, entitled "Protective Layer to Enable Damage Free Gap Fill."

(Continued)

*Primary Examiner* — Duy Deo
*Assistant Examiner* — Maki Angadi
(74) *Attorney, Agent, or Firm* — Weaver Austin Villeneuve & Sampson LLP

(57) ABSTRACT

Methods for controlled isotropic etching of layers of silicon oxide and germanium oxide with atomic scale fidelity are provided. The methods make use of a reaction of anhydrous HF with an activated surface of an oxide, with an emphasis on removal of water generated in the reaction. In certain embodiments the oxide surface is first modified by adsorbing an OH-containing species (e.g., an alcohol) or by forming OH bonds using a hydrogen-containing plasma. The activated oxide is then etched by a separately introduced anhydrous HF, while the water generated in the reaction is removed from the surface of the substrate as the reaction proceeds, or at any time during or after the reaction. These methods may be used in interconnect pre-clean applications, gate dielectric processing, manufacturing of memory devices, or any other applications where accurate removal of one or multiple atomic layers of material is desired.

20 Claims, 5 Drawing Sheets

(51) Int. Cl.
*H01J 37/32* (2006.01)
*C23C 16/52* (2006.01)
*C23C 16/50* (2006.01)
*C23C 16/458* (2006.01)

(56) References Cited

U.S. PATENT DOCUMENTS

| | | | |
|---|---|---|---|
| 4,695,327 | A | 9/1987 | Grebinski |
| 4,756,794 | A | 7/1988 | Yoder |
| 5,030,319 | A | 7/1991 | Nishino et al. |
| 5,234,540 | A | 8/1993 | Grant et al. |
| 5,268,069 | A | 12/1993 | Chapple-Sokol et al. |
| 5,282,925 | A | 2/1994 | Jeng et al. |
| 5,439,553 | A | 8/1995 | Grant et al. |
| 5,474,641 | A | 12/1995 | Otsuki et al. |
| 5,505,816 | A | 4/1996 | Barnes et al. |
| 5,635,102 | A * | 6/1997 | Mehta .............. H01L 21/31116 134/2 |
| 5,636,320 | A | 6/1997 | Yu et al. |
| 5,766,971 | A | 6/1998 | Ahlgren et al. |
| 5,792,275 | A | 8/1998 | Natzle et al. |
| 5,838,055 | A | 11/1998 | Kleinhenz et al. |
| 5,858,830 | A | 1/1999 | Yoo et al. |
| 5,876,879 | A | 3/1999 | Kleinhenz et al. |
| 5,913,140 | A | 6/1999 | Roche et al. |
| 5,968,279 | A | 10/1999 | Macleish et al. |
| 5,976,973 | A | 11/1999 | Ohira et al. |
| 5,990,019 | A | 11/1999 | Torek et al. |
| 5,994,240 | A | 11/1999 | Thakur |
| 6,030,881 | A | 2/2000 | Papasouliotis et al. |
| 6,069,092 | A | 5/2000 | Imai et al. |
| 6,071,815 | A | 6/2000 | Kleinhenz et al. |
| 6,074,951 | A | 6/2000 | Kleinhenz et al. |
| 6,146,970 | A | 11/2000 | Witek et al. |
| 6,204,198 | B1 | 3/2001 | Banerjee et al. |
| 6,265,302 | B1 | 7/2001 | Lim et al. |
| 6,335,261 | B1 | 1/2002 | Natzle et al. |
| 6,483,154 | B1 | 11/2002 | Ngo et al. |
| 6,573,181 | B1 | 6/2003 | Srinivas et al. |
| 6,652,713 | B2 | 11/2003 | Brown et al. |
| 6,693,050 | B1 | 2/2004 | Cui et al. |
| 6,706,334 | B1 | 3/2004 | Kobayashi et al. |
| 6,716,691 | B1 | 4/2004 | Evans et al. |
| 6,726,805 | B2 | 4/2004 | Brown et al. |
| 6,740,247 | B1 * | 5/2004 | Han .................. H01L 21/02049 216/73 |
| 6,774,000 | B2 | 8/2004 | Natzle et al. |
| 6,776,874 | B2 | 8/2004 | Kobayashi et al. |
| 6,790,733 | B1 | 9/2004 | Natzle et al. |
| 6,803,309 | B2 | 10/2004 | Chou et al. |
| 6,817,776 | B2 | 11/2004 | Colgan et al. |
| 6,837,968 | B2 | 1/2005 | Brown et al. |
| 6,852,584 | B1 | 2/2005 | Chen et al. |
| 6,858,532 | B2 | 2/2005 | Natzle et al. |
| 6,905,965 | B2 | 6/2005 | Subrahmanyan et al. |
| 6,926,843 | B2 | 8/2005 | Cantell et al. |
| 6,949,481 | B1 | 9/2005 | Halliyal et al. |
| 6,951,821 | B2 | 10/2005 | Hamelin et al. |
| 6,967,167 | B2 | 11/2005 | Geiss et al. |
| 6,992,011 | B2 | 1/2006 | Nemoto et al. |
| 7,029,536 | B2 | 4/2006 | Hamelin et al. |
| 7,033,909 | B2 | 4/2006 | Kim et al. |
| 7,052,941 | B2 | 5/2006 | Lee et al. |
| 7,079,760 | B2 | 7/2006 | Hamelin et al. |
| 7,163,899 | B1 | 1/2007 | Cho et al. |
| 7,416,989 | B1 | 8/2008 | Liu et al. |
| 7,435,661 | B2 | 10/2008 | Miller et al. |
| 7,651,922 | B2 | 1/2010 | Matsuda |
| 7,977,249 | B1 | 7/2011 | Liu et al. |
| 7,981,763 | B1 | 7/2011 | Van Schravendijk et al. |
| 8,043,972 | B1 | 10/2011 | Liu et al. |
| 8,058,179 | B1 | 11/2011 | Draeger et al. |
| 8,187,486 | B1 | 5/2012 | Liu et al. |
| 8,617,348 | B1 | 12/2013 | Liu et al. |
| 2001/0016226 | A1 | 8/2001 | Natzle et al. |
| 2002/0106908 | A1 | 8/2002 | Cohen et al. |
| 2003/0029568 | A1 | 2/2003 | Brown et al. |
| 2003/0134038 | A1 | 7/2003 | Paranjpe |
| 2004/0018740 | A1 | 1/2004 | Brown et al. |
| 2004/0083977 | A1 | 5/2004 | Brown et al. |
| 2004/0110354 | A1 | 6/2004 | Natzle et al. |
| 2004/0182324 | A1 | 9/2004 | Wallace et al. |
| 2004/0184792 | A1 | 9/2004 | Hamelin et al. |
| 2004/0185670 | A1 | 9/2004 | Hamelin et al. |
| 2004/0200244 | A1 | 10/2004 | Hung et al. |
| 2004/0212035 | A1 | 10/2004 | Yeo et al. |
| 2005/0056370 | A1 | 3/2005 | Brown et al. |
| 2005/0101130 | A1 | 5/2005 | Lopatin et al. |
| 2005/0106877 | A1 | 5/2005 | Elers et al. |
| 2005/0116300 | A1 | 6/2005 | Hieda et al. |
| 2005/0153519 | A1 | 7/2005 | Lu et al. |
| 2005/0205110 | A1 | 9/2005 | Kao et al. |
| 2005/0218113 | A1 | 10/2005 | Yue |
| 2005/0218507 | A1 | 10/2005 | Kao et al. |
| 2005/0221552 | A1 | 10/2005 | Kao et al. |
| 2005/0230350 | A1 | 10/2005 | Kao et al. |
| 2005/0266684 | A1 | 12/2005 | Lee et al. |
| 2005/0270895 | A1 | 12/2005 | Strang |
| 2006/0003596 | A1 | 1/2006 | Fucsko et al. |
| 2006/0051966 | A1 | 3/2006 | Or et al. |
| 2006/0115937 | A1 | 6/2006 | Barnett et al. |
| 2007/0063277 | A1 | 3/2007 | Belyansky et al. |
| 2007/0215975 | A1 | 9/2007 | Idani et al. |
| 2008/0233709 | A1 | 9/2008 | Conti et al. |
| 2010/0062602 | A1 | 3/2010 | Sakamoto et al. |
| 2015/0118848 | A1 | 4/2015 | Draeger et al. |

FOREIGN PATENT DOCUMENTS

| | | |
|---|---|---|
| KR | 10-2005-0110751 | 11/2005 |
| KR | 10-2006-0000876 | 1/2006 |
| KR | 10-2007-0029851 | 3/2007 |
| WO | WO 04/001809 | 12/2003 |

OTHER PUBLICATIONS

U.S. Appl. No. 12/244,241, filed Oct. 2, 2008, entitled "Gap fill using pulsed deposition layer and atomic layer removal."
U.S. Appl. No. 12/144,518, filed Jun. 23, 2008, entitled "Gap fill using pulsed deposition layer and atomic layer removal."
U.S. Appl. No. 13/244,032, filed Sep. 23, 2011, enititled "Atomic Layer Removal Process with Higher Etch Amount".
U.S. Appl. No. 14/531,483, filed Nov. 3, 2014, enititled "Atomic Layer Removal Process with Higher Etch Amount".
U.S. Appl. No. 14/590,801, filed Jan. 6, 2015, entitled "Isotropic Atomic Layer Etch for Silicon Oxides Using No Activation".
US Office Action, dated May 2, 2007, issued in U.S. Appl. No. 11/479,812.
US Final Office Action, dated Jul. 17, 2007, issued in U.S. Appl. No. 11/479,812.
US Office Action, dated Dec. 5, 2007, issued in U.S. Appl. No. 11/479,812.
US Final Office Action, dated May 7, 2008, issued in U.S. Appl. No. 11/479,812.
US Notice of Allowance, dated Jul. 1, 2008, issued in U.S. Appl. No. 11/479,812.
US Office Action, dated Feb. 15, 2011, issued in U.S. Appl. No. 12/174,402.
US Notice of Allowance, dated Jul. 13, 2011, issued in U.S. Appl. No. 12/174,402.
US Notice of Allowance, dated Mar. 7, 2011, issued in U.S. Appl. No. 12/074,912.
US Office Action, dated Jun. 9, 2011, issued in U.S. Appl. No. 12/002,171.
US Final Office Action, dated Nov. 17, 2011, issued in U.S. Appl. No. 12/002,171.
US Office Action, dated Apr. 12, 2011, issued in U.S. Appl. No. 12/002,085.
US Office Action, dated Sep. 30, 2011, issued in U.S. Appl. No. 12/002,085.

(56) References Cited

OTHER PUBLICATIONS

US Notice of Allowance, dated Feb. 3, 2012, issued in U.S. Appl. No. 12/002,085.
US Office Action, dated Jan. 17, 2013, issued in U.S. Appl. No. 13/461,080.
US Final Office Action, dated Jun. 26, 2013, issued in U.S. Appl. No. 13/461,080.
US Notice of Allowance, dated Aug. 28, 2013, issued in U.S. Appl. No. 13/461,080.
US Office Action, dated Feb. 3, 2011, issued in U.S. Appl. No. 12/244,241.
US Office Action, dated Jan. 29, 2010, issued in U.S. Appl. No. 12/144,518.
US Office Action, dated Jun. 14, 2010, issued in U.S. Appl. No. 12/144,518.
US Office Action, dated Jun. 11, 2010, issued in U.S. Appl. No. 12/341,943.
US Final Office Action, dated Dec. 23, 2010, issued in U.S. Appl. No. 12/341,943.
US Notice of Allowance, dated Mar. 15, 2011, issued in U.S. Appl. No. 12/341,943.
US Office Action, dated Apr. 21, 2011, issued in U.S. Appl. No. 12/343,102.
US Notice of Allowance, dated Sep. 14, 2011, issued in U.S. Appl. No. 12/343,102.
US Office Action, dated Nov. 22, 2013, issued in U.S. Appl. No. 13/244,032.
US Final Office Action, dated Jul. 2, 2014, issued in U.S. Appl. No. 13/244,032.
Korean Office Action dated Apr. 8, 2014, issued in KR 10-2008-0063247.
Athavale et al. (1995) "Molecular dynamics simulation of atomic layer etching of silicon," *J. Vac. Sci. Technol. A*, 13(3):966-971.
Byun et al. (2001) "The Effects of Reactive Precleaning (RPC+) on the Formation of Titanium Silicide by PECVD $TiCl_4$-Ti Deposition, and Its Thermal Stability," *IEEE*, pp. 222-224.
Chang et al. (1997) "Interface Characteristics of Selective Tungsten on Silicon Using a New Pretreatment Technology for ULSI Application," *IEEE*, pp. 738 743.
Honda et al. (2005) "Chemical Dry Cleaning Technology for Reliable 65nm CMOS contact to $NiSi_x$," *IITC*, paper 9.4.
Jong et al. (2002) "Fabrication of MEMS devices by using anhydrous HF gas-phase etching with alcoholic vapor," *Journal of Micromechanics and Microengineering*, 12:297-306.

Kim et al. (2003) "New Contact Cleaning in HF & N2/H2 Microwave Plasma," *Solid State Phenomena*, 92:239-242.
Meguro et al. (1990) "Digital etching of GaAs: New approach of dry etching to atomic ordered processing," *American Institute of Physics* pp. 1552-1554.
Natzle et al. (2004) "Trimming of hard-masks by Gaseous Chemical Oxide Removal (COR) for Sub-10nm Gates/Fins, for Gate Length Control and for Embedded Logic," *2004 IEEE/SEMI Advanced Semiconductor Manufacturing Conference*, pp. 61-65.
Nishino et al. (1993) "Damage-free selective etching of Si native oxides using NH3/NF3 and SF6/H2O down-flow etching," *J. Appl. Phys.* 74(2):1345-1348.
Ogawa et al. (2002) "Dry Cleaning Technology for Removal of Silicon Native Oxide Employing Hot NH3/NF3 Exposure," *The Japan Society of Applied Physics*, Part I, No. 8, pp. 5349-5358.
Okamura et al. (2004) "Low Damage via Formation with Low Resistance by NH3 Thermal Reduction for Cu / Ultra Low-k Interconnects," *IEEE*, pp. 42-44.
Park et al. (1996) "Low Damage in Situ Contact Cleaning Method by a Highly Dense and Directional ECR Plasma," *Jpn J. Appl. Phys* 35:1097-1101.
Park et al. (2005) "Atomic Layer Etching of Si(100) and Si(111) Using Cl2 and Ar Neutral Beam," *Electrochemical and Solid-State Letters*, 8(8) C106-C109.
Phan et al. (2006) "Integrated Clean Process Using NF3/NH3 Remote Plasma for Nickle Silicide Formation," *SEMICON Korea STS 2006*, pp. 159-163.
Taguwa et al. (2000) "ICP-Ar/$H_2$ Precleaning and Plasma Damage-Free Ti-PECVD for Sub-Quarter Micron Contact of Logic with Embedded DRAM," *Conference Proceedings USLI XV 2000*, pp. 589-593.
Yang et al. (1998) "Ultrahigh-selectivity silicon nitride etch process using an inductively coupled plasma source," *J. Vac. Sci. Technol. A*, 16(3):1582-1587.
US Office Action, dated Apr. 9, 2015, issued in U.S. Appl. No. 14/531,483.
US Office Action, dated Dec. 30, 2015, issued in U.S. Appl. No. 14/531,483.
US Office Action, dated Mar. 1, 2016, issued in U.S. Appl. No. 14/590,801.
Matsuo et al. (Sep./Oct. 1999) "Silicon etching in $NF_3/O_2$ remote microwave plasmas," *J. Vac. Sci. Technol. A*, 17(5):2431-2437.

\* cited by examiner

ISOTROPIC ATOMIC LAYER ETCH FOR SILICON AND GERMANIUM OXIDES

FIELD OF THE INVENTION

The present invention pertains to methods of removing layers of material on a substrate. The methods are particularly useful for accurate isotropic removal of silicon dioxide and germanium dioxide with atomic scale fidelity on a semiconductor substrate.

BACKGROUND OF THE INVENTION

Fabrication of integrated circuit (IC) devices at a modern level of miniaturization demands techniques that can operate at an atomic scale. Certain components of IC devices now have dimensions of tens of Angstroms, corresponding to only a few atomic layers of material. For example, gate dielectric in modern IC transistors can have a thickness of only 12 Å, corresponding to only four atomic layers of silicon dioxide. It is often desirable to fine-tune the electronic properties of these components by altering their dimensions, which would involve deposition or removal of only a few atomic layers of material. While atomic layer deposition (ALD) and atomic-scale epitaxial growth techniques have been developed, the methods for controlled removal of one or several atomic layers are still limited.

Silicon oxides, silicon dioxide and its carbon-doped, boron-doped, and phosphorous-doped variants, are important dielectric materials used in IC devices. Silicon oxides serve as an insulator in bulk dielectric layers, as a gate dielectric in transistors, and as a capacitor dielectric in memory devices, such as dynamic random-access memory (DRAM). Silicon oxide also is inadvertently formed on the layers of silicon when the partially fabricated wafer is exposed to air. This type of silicon oxide, known as native oxide, forms a thin film on the layer of silicon. Native oxide film together with oxide residue produced during etching and/or ashing frequently presents a problem for further processing steps. When formed in the bottom of a silicon landed via or contact hole, native oxide and other oxides are highly undesired, since they raise the overall electrical resistance of the via after it is filled with conductive materials.

There is a wealth of literature describing gas phase etching of silicon oxides. The majority of these processes are essentially plasma processes, in which the reactant gases are introduced into a plasma source located in a process chamber to generate ionic and metastable species which react with the silicon oxide surface and form volatile etch by-products. In most of these processes the etch rate of the silicon oxide is controlled by the flow rate and composition of the reactant gases, plasma power, substrate temperature, or chamber pressure. The etch rate of the silicon oxide is nearly constant over time; as such, these types of processes are not well suited to accurately control the amount of a layer to be etched uniformly and precisely over all the exposed surface on the substrate. These processes cannot be applied for removal of defined amounts of material on an atomic scale.

Therefore there is a need for a reliable method for removal of defined amounts of material on an atomic scale with atomic-scale uniformity and low defectivity.

SUMMARY

The methods provided herein may be used in the processes for manufacturing integrated circuits such as in interconnect and contact pre-clean applications, gate dielectric processing, manufacturing of memory and logic devices, or any other applications where precise removal of one or several atomic layers of material is desired. Processes for isotropic removal of controlled amounts of silicon oxide and germanium oxide, as well as mixtures of silicon oxide and germanium oxide are provided.

In one aspect, a method for controllably etching an oxide layer on a substrate is provided, wherein the oxide is selected from the group consisting of silicon oxide, germanium oxide, and a combination of silicon oxide and germanium oxide, wherein the term "oxide" includes both undoped and doped oxides, such as silicon and germanium oxides that are doped with boron, carbon or phosphorous. In some embodiments, the etching method controllably and selectively removes these oxides in a presence of exposed silicon with atomic scale fidelity. The method includes: (a) contacting the substrate housed in a process chamber with an active hydrogen-containing species to modify the surface of the oxide on the substrate, wherein the active hydrogen-containing species is a compound containing one or more OH groups, or a hydrogen-containing species generated in a hydrogen plasma; (b) removing non surface-bound active hydrogen species from the process chamber after the surface of the oxide is modified; (c) flowing an anhydrous HF into the process chamber after (b), wherein the anhydrous HF reacts with the modified surface of the oxide and wherein the reaction generates water; and (d) removing the water generated in (c) from the surface of the substrate. In some embodiments, modification of the surface of the oxide in (a) is an adsorption of the active hydrogen-containing species on the surface of the oxide. In some embodiments, a single cycle of operations (a)-(d) removes about 0.5-10 atomic layers of oxide (referring to an average thickness removed). In some embodiments, the cycle is repeated and the operations (a)-(d) are performed at least twice during the etching.

In some embodiments, the HF reaction and removal of water from the surface of the substrate are performed concurrently under a temperature and pressure that does not permit water to stay adsorbed to the substrate surface, as water is generated in the reaction. In some embodiments, operations (a)-(d) are performed at a single temperature of at least about 80° C., e.g., at least about 100° C.

In some embodiments, the active hydrogen-containing species is an alcohol that is capable of adsorbing or staying adsorbed to the surface of the oxide under conditions when water is desorbed from the surface of oxide. Examples of such alcohols include alcohols that have a vapor pressure that is lower than water, or alcohols with a vapor pressure that is not significantly higher than the vapor pressure of water, such as isopropanol, n-propanol, n-butanol, tert-butanol, ethylene glycol, propylene glycol, etc. In some embodiments, operations (a)-(d) are performed at a temperature and pressure, that do not permit these alcohols to be desorbed from the surface of the substrate.

In other embodiments the active hydrogen-containing species is formed from a hydrogen-containing plasma, and the hydroxyl (OH) bonds are formed on the surface of the oxide by contacting the substrate with a hydrogen containing plasma under conditions when water is desorbed from the surface of the oxide. The hydrogen-containing plasma is formed from a gas comprising a hydrogen containing gas, such as $H_2$, ammonia, hydrazine, water, hydrogen fluoride, hydrogen chloride, silane, disilane, methane, ethane, butane, and combinations thereof. Optionally, a second gas can be added to the gas comprising the hydrogen-containing gas. Examples of such second gas include oxygen, nitrous oxide, nitric oxide, carbon dioxide, carbon monoxide and combinations thereof. Optionally, an inert gas (e.g., helium, neon, argon or combinations thereof) may be added to the gas that comprises the hydrogen containing gas.

In some embodiments the active hydrogen-containing species is selected from the group consisting of a propanol, a butanol, butoxyethanol, butanediol, ethylene glycol, methylene glycol, propylene glycol, amyl alcohol, a carboxylic acid, and combinations thereof. In one specific implementation, butanol is used. The alcohol (such as butanol) adsorbs on the substrate, and then HF treatment is performed concurrently with water removal.

In some embodiments the active hydrogen-containing species is selected from the group consisting of methanol, ethanol, propanol, butanol, butoxyethanol, ethylene glycol, methylene glycol, propylene glycol, amyl alcohol and combinations thereof, and the operations (a)-(d) are performed at the same temperature. The process is preferably configured in this embodiment such that water is being removed from the surface of oxide as it is generated in the reaction.

In some embodiments the active hydrogen-containing species is characterized by a vapor pressure that is lower or not substantially higher than the vapor pressure of water for selected conditions, wherein the operations (a)-(d) are performed at the same temperature, and wherein water is being removed from the surface of oxide as it is generated in the reaction. The temperature is selected such that the active hydrogen-containing species is not desorbed, before the reaction is completed, while water is desorbed from the surface. In this embodiment, the amount of removed oxide is determined by the amount of surface modification in step (a), and HF can be introduced in excess.

In other embodiments, the active hydrogen-containing species is methanol, ethanol, water, a water-alcohol azeotrope or an OH-containing species that has a vapor pressure that is substantially higher than the vapor pressure of water. Methanol (or one of the species listed above) adsorbs to the surface of oxide in (a), and the process is configured such that the anhydrous HF is provided in (c) in a controlled, limited amount. In this embodiment, the amount of etched oxide is controlled by the amount of introduced HF.

In some embodiments the active hydrogen-containing species is methanol or ethanol that adsorbs to the surface of oxide in (a) at a first temperature, the water is removed in (d) by raising the temperature of the substrate to a second temperature that is higher than the first temperature. In some implementations of this method the flow of the anhydrous HF into the process chamber is ceased before water is removed.

In some embodiments water is removed by a method selected from the group consisting of: (i) raising the temperature of the substrate, (ii) lowering pressure in the process chamber, (iii) treating the substrate with a plasma, (iv) treating the substrate with an electron beam, (iv) irradiating the substrate with an electromagnetic radiation, and combinations of these methods.

In an alternative aspect of the invention, a method for controllably etching an oxide layer on a substrate starts by adsorbing anhydrous HF to the substrate. Similarly to the methods described above, this method can be used to etch silicon oxide, germanium oxide and combinations of these oxides. In some embodiments, the etching method controllably and selectively removes these oxides in a presence of exposed silicon. The method includes: (a) contacting the substrate housed in a process chamber with anhydrous HF and allowing the HF to adsorb on the substrate; (b) removing non surface-bound HF from the process chamber; (c) treating the substrate with an active hydrogen-containing species to react it with the HF adsorbed on the substrate, wherein the active hydrogen-containing species is a compound containing one or more OH groups (e.g., an alcohol), or a hydrogen-containing species generated in a hydrogen plasma; and (d) removing the water generated in (c) from the surface of the substrate. The methods of water removal can be the same as described above.

In some embodiments, the methods described herein are used in conjunction with photolithographic device processing. For example, the methods may further involve applying photoresist to the substrate; exposing the photoresist to light; patterning the photoresist and transferring the pattern to the substrate; and selectively removing the photoresist from the substrate.

In another aspect, an etching apparatus for controllably etching an oxide on a substrate is provided. The apparatus includes: a process chamber having an inlet for introduction of process gases; a substrate support in the process chamber configured for holding the substrate in position during etching of the oxide on the substrate; and a controller comprising program instructions for performing the steps of any of the methods described herein. For example the controller may include program instructions for: (a) contacting the substrate housed in the process chamber with an active hydrogen-containing species to modify the surface of the oxide on the substrate, wherein the active hydrogen-containing species is a compound containing one or more OH groups, or a hydrogen-containing species generated in a hydrogen containing plasma, and wherein the oxide is selected from the group consisting of silicon oxide, germanium oxide (including doped and undoped oxides) and combinations thereof; (b) removing non surface-bound active hydrogen species from the process chamber after the surface of oxide is modified; (c) flowing an anhydrous HF into the process chamber after (b), wherein the anhydrous HF reacts with the modified surface of oxide and wherein the reaction generates water; and (d) removing the water generated in (c) from the surface of the substrate. The apparatus, in some embodiments, is equipped with a temperature controller that allows for rapid and controlled changes in temperature at the substrate.

In some embodiments, a system is provided, wherein the system includes an apparatus described above and a stepper.

In yet another aspect, a non-transitory computer machine-readable medium is provided to control the apparatus provided herein. The machine-readable medium comprises code to perform any of the methods described herein, such as the method comprising: (a) contacting the substrate housed in the process chamber with an active hydrogen-containing species to modify the surface of the oxide on the substrate, wherein the active hydrogen-containing species is a compound containing one or more OH groups, or a hydrogen-containing species generated in a hydrogen containing plasma, and wherein the oxide is selected from the group consisting of silicon oxide, germanium oxide and combinations thereof; (b) removing non surface-bound active hydrogen species from the process chamber after the surface of oxide is modified; (c) flowing an anhydrous HF into the process chamber after (b), wherein the anhydrous HF reacts with the modified surface of oxide and wherein the reaction generates water; and (d) removing the water generated in (c) from the surface of the substrate.

These and other features and advantages of the invention will be described in more detail below with reference to the associated drawings.

DETAILED DESCRIPTION OF A PREFERRED EMBODIMENT

Figure 1:
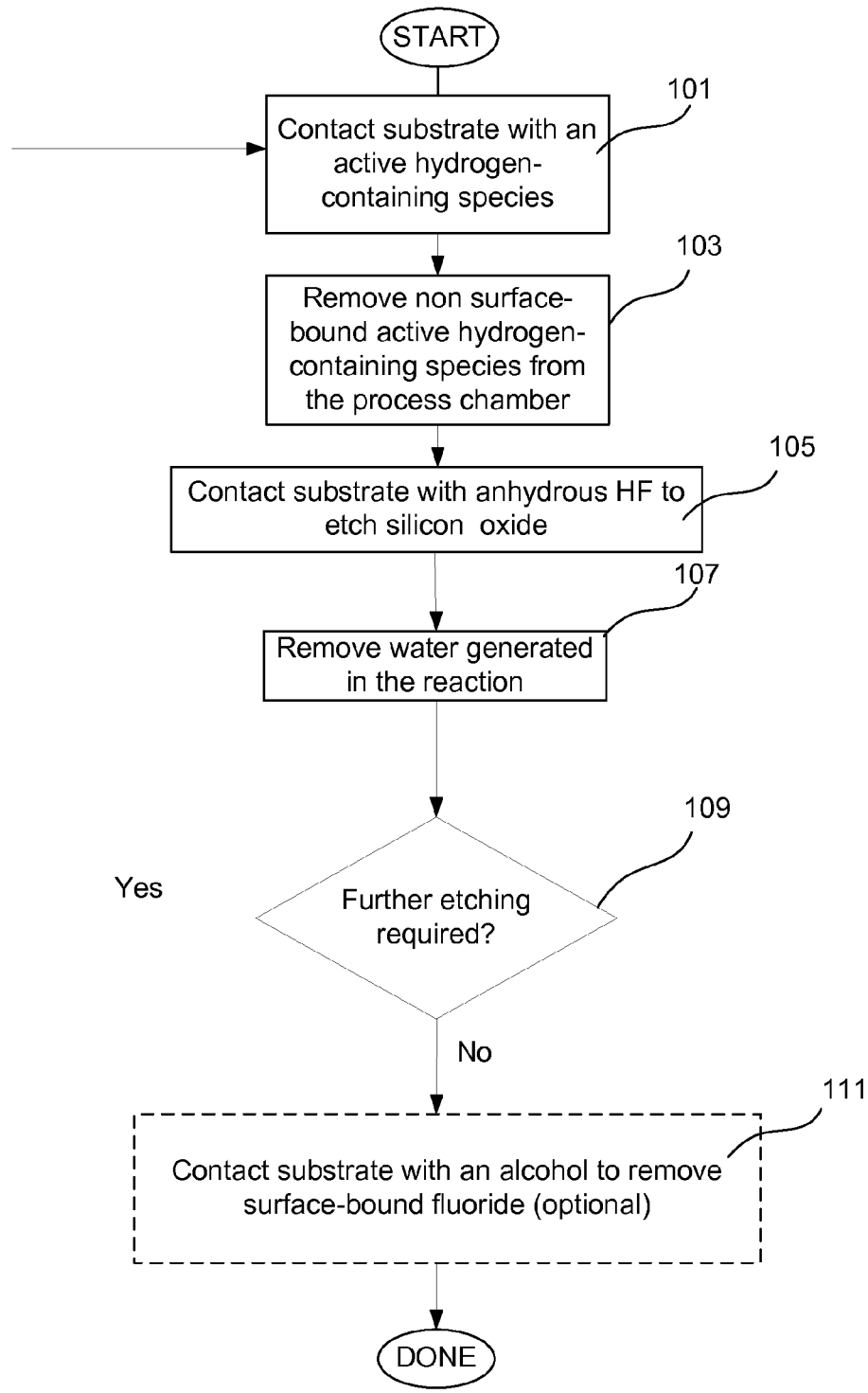
FIG. 1 is a process flow diagram for an etching method in accordance with an embodiment provided herein.

Aspects of the present invention are directed to controlled etching of silicon oxide, and germanium oxide (including doped and undoped silicon and germanium oxides) from substrates, such as partially fabricated integrated circuits. While the methods of present invention find particular use in the processing of semiconductor substrates, they can also be employed in other applications. Provided methods achieve accurate and isotropic removal of material on small scales, e.g. on the scale of about 150 Å or smaller. In fact, they can be employed when removal of layers of only several Angstroms or tens of angstroms is desired. Atomic layer etching methods provided herein allow control of the depth of etching by repeating the etching cycles, where each cycle may remove as little as only an atomic monolayer or submonolayer of material. These methods can be performed in a CVD-type or plasma-type apparatus (e.g., in a resist strip chamber), and can be easily integrated with existing wafer manufacturing processes.

The methods can be used to etch silicon oxide, germanium oxide and mixtures of these oxides. The oxides can be doped (e.g., with nitrogen, carbon, boron, phosphorus, etc.) or undoped. The term "silicon oxide" as used herein includes a variety of types of silicon oxides, silicates, and silicate-based glasses, such as tetraethylorthosilicate (TEOS), borosilicate glass (BSG), borophosphosilicate glass (BPSG), high density plasma (HDP) CVD oxide, and subatmospheric (SA) CVD oxide.

The applications of atomic layer removal methods include but are not limited to pre-clean operations, gate dielectric fabrication, processing of fin oxide recesses, and processing of capacitor dielectric in memory devices, such as dynamic random access memory (DRAM) and flash memory devices. The atomic layer etching pre-clean of interconnects may involve removal of silicon oxide from silicon, active silicon, polysilicon, and silicide contacts. Silicide contacts comprise metal silicides, such as nickel and cobalt silicides, ternary silicides, such as platinum nickel silicides and other silicide materials, commonly used in interconnects. Active silicon contacts refer to electrically active contacts typically formed with electrically active doped silicon material. The methods are particularly suitable in fabrication of devices at sub-10 nm level and can be used in fabrication of double-gate transistors, such as FinFETs and Gate-all-around (GAA) FETs.

Provided methods allow for selective etching of silicon oxide, germanium oxide or their combinations in a presence of exposed silicon, germanium or silicon germanium. Selective etching refers to a selectivity of at least 5:1, where the ratio refers to the etch rate ratio.

While provided methods can be used to etch both silicon and germanium oxides, the methods will be illustrated using silicon oxide as an example. It is understood that all of the described principles and embodiment illustrations also apply to the etching of germanium oxide.

Etching can be performed on substrates with or without recessed features (such as vias, trenches, and contact holes), and silicon oxide can be removed from any location on the substrate including the field region, sidewalls of a recessed feature and bottom of a recessed feature. Due to self-limiting adsorption-based mechanism of the etching reaction, silicon oxide can be removed isotropically, that is, substantially the same amount of oxide is removed from the field region, sidewall and the bottom of the recessed feature, and the amount of removed oxide is substantially independent of the aspect ratio of the recessed feature. Further, oxide can be removed with high uniformity, that is, substantially same amounts of oxide can be removed from the center and edge of a semiconductor wafer substrate. It is important to note that the methods provided herein, unlike those that rely on $NH_4F$ etchant, do not produce solid reaction products, therefore resulting in low defectivity and in excellent repeatable isotropic etching within high aspect ratio recessed features.

Mechanism of Etching of Silicon Oxide with HF

Anhydrous HF does not etch silicon dioxide in an absence of an active hydrogen-containing species, such as water or alcohol. When an anhydrous HF contacts a surface of silicon oxide, it is adsorbed to the surface without etching the surface as shown in equation (1):

$$HF(gas) \leftrightarrows HF(adsorbed) \quad (1)$$

When an active hydrogen-containing species such as methanol is adsorbed to the surface, it reacts with the adsorbed HF to form $HF_2^-$ ion, which is the active etching species, as shown in equations (2)-(4). The etching reaction generates water and silicon tetrafluoride as shown in reaction (4).

$$CH_3OH(gas) \leftrightarrows CH_3OH(ads) \quad (2)$$

$$CH_3OH(ads) + HF(ads) \leftrightarrows HF_2^-(ads) + CH_3OH_2^+(ads) \quad (3)$$
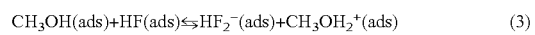

$$SiO_2(s) + 2HF_2^-(ads) + 2CH_3OH_2^+(ads) \rightarrow SiF_4(ads) + 2H_2O(ads) + 2CH_3OH \quad (4)$$
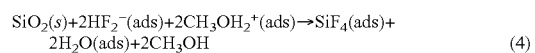

While silicon tetrafluoride is a volatile compound that is easily desorbed from the surface of the substrate, adsorbed water creates a number of problems that renders controlled etching of silicon dioxide a difficult task. First, the presence of water on the surface of the substrate leads to $HF_2^-$ formation and to progression of the etching reaction, even if originally the active hydrogen containing species (such as methanol) was provided in a limited amount. Therefore, in a presence of adsorbed water the reaction would not be self-limiting and would proceed as long as HF is available. Further, the presence of water on the substrate causes $SiF_4$ to form silicon oxide particles, as shown in equation 5. These particles may lead to defects and to non-uniformity during etching as well as to lower repeatability in reaction rates.

$$3SiF_4 + 2H_2O \rightarrow SiO_2 + 2H_2SiF_6 \quad (5)$$

It is also important to note, that if the active hydrogen-containing species is desorbed from the surface of the substrate together with water, e.g., by heating, the etching reaction would stop. Therefore a fine balance should be found between desorbing the water generated in the etching reaction and maintaining the active hydrogen-containing species on the surface of the substrate at least until the desired amount of oxide is etched.

Etching Methods

FIG. 1 is a process flow diagram illustrating an etching method for silicon oxide and/or germanium oxide, in accordance with embodiments provided herein. FIGS. 2A-2D illustrate a schematic presentation of cross-sectional views of a silicon oxide containing substrate undergoing the controlled etching. Referring to FIG. 1, the process starts in 101 by contacting the substrate with an active hydrogen-containing species containing one or more OH groups. The active hydrogen containing species can be an alcohol (wherein the term "alcohol" includes glycols), a carboxylic acid, a hydrogen-containing species generated from hydrogen-containing plasma, and in some embodiments, water. It is noted that ammonia is excluded from the list of suitable compounds. Examples of suitable alcohols include methanol, ethanol, n-propanol, isopropanol, n-butanol, tert-butanol, methylbutanols, amyl alcohol, methylene glycol, ethylene glycol, propylene glycol, and the like. Examples of carboxylic acids include formic acid, acetic acid, propionic acid and the like. Mixtures of various hydrogen-containing species can also be used. Examples of hydrogen-containing species generated from a hydrogen-containing plasma include hydrogen-containing ions and radicals. The active hydrogen-containing species is typically introduced into the process chamber housing the substrate in a gaseous form and may be accompanied by a carrier gas, such as $N_2$, Ar, Ne, He, and combinations thereof. The species generated from a hydrogen-containing plasma can be generated directly by forming a plasma in the process chamber housing the substrate or they can be generated remotely in a process chamber that does not house the substrate, and can be supplied into the process chamber housing the substrate.

The active hydrogen-containing species modifies the silicon oxide surface on the substrate, e.g., by adsorbing to silicon oxide and/or by modifying silicon-oxygen bonds on the surface of the substrate. For example an alcohol or a carboxylic acid can chemisorb to the surface of silicon oxide. This step is also referred to as hydroxylation, because it results in formation of OH bonds on the surface of the substrate. The process conditions, such as temperature and pressure for this step are selected such that the chemisorption takes place without condensation of bulk amount of the hydrogen-containing species. In some embodiments, the process chamber may be heated to avoid condensation of higher alcohols on the walls of the chamber.

After the hydrogen-containing species has adsorbed or has otherwise modified the surface of silicon oxide, in operation 103 the non surface-bound active hydrogen containing species is removed from the process chamber. This can be done by purging and/or evacuating the process chamber to remove the active species (e.g., an alcohol or an acid), without removing the adsorbed layer. The species generated in a hydrogen plasma can be removed by simply stopping the plasma and allowing the remaining species decay, optionally combined with purging and/or evacuation of the chamber. Purging can be done using any inert gas such as $N_2$, Ar, Ne, He and their combinations.

Figure 2A:
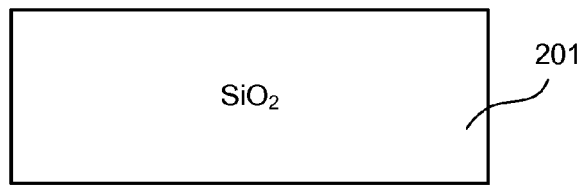
FIGS. 2A-2D present cross-sectional depictions of a substrate undergoing etching in accordance with embodiments provided herein.
Figure 2B:
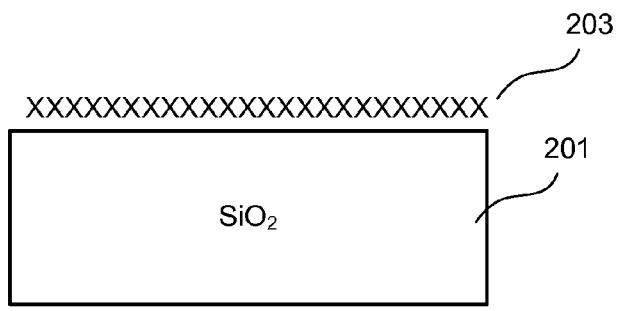

Referring to FIG. 2A, the substrate 201 containing a layer of silicon oxide is shown. After hydroxylation and removal of the bulk amount of the active hydrogen-containing species from the process chamber, only a surface layer 203 remains on the substrate 201, as shown in FIG. 2B. Surface layer 203 may be for example a chemisorbed layer of alcohol or of other hydrogen-containing species.

Figure 2C:
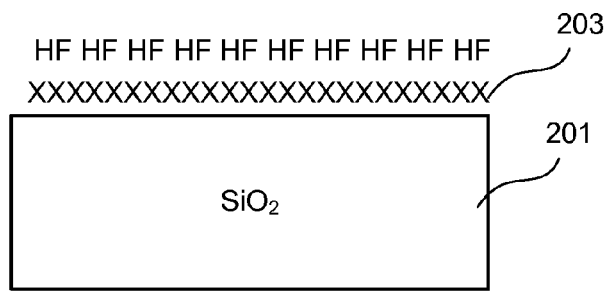

Next, referring to step 105 of FIG. 1, the substrate is contacted with anhydrous HF Anhydrous HF is flowed into the chamber without concurrent flow of an active hydrogen-containing species (e.g., alcohol, or a species generated in hydrogen plasma) and is allowed to react with the modified layer of silicon oxide, as shown in FIG. 2C. In some embodiments, the amount of HF introduced into the process chamber is not limited, because the reaction would be limited by the adsorbed hydrogen-containing species. In other embodiments, HF may be provided in a controlled, limited amount such as to etch only a targeted amount of material. At least in the first portion of the HF dosing, the process conditions should be maintained such that the active hydrogen-containing species remains bound to the surface of the substrate, because premature desorption of the active hydrogen-containing species may cause the reaction to stop. Desorption of the active hydrogen-containing species may be initiated after a desired amount of etching has occurred.

As shown in operation 107, water generated in the etching reaction is removed from the surface of the substrate. A variety of methods can be used to remove water. For example, water desorption from the surface of the substrate can be achieved by using a sufficiently high temperature of the substrate. The temperature is selected to cause water desorption, or not allow water to be adsorbed as it is generated in the course of the reaction. In another example, water removal is achieved by using a sufficiently low pressure, which in combination with appropriate temperature does not allow water to stay adsorbed on the surface of the substrate, or removes water without allowing it to become adsorbed as the water is generated.

In some embodiments water removal is achieved by raising the temperature of the substrate to a temperature that is sufficient to remove water. In some embodiments, the HF dosing is performed at a temperature that is sufficient to remove water. In some embodiments, the entire etching process, including treatment with an active hydrogen-containing species and HF dosing are performed at a temperature that is sufficient to remove water from the surface of the substrate as it is generated. In some embodiments water removal is achieved by lowering the pressure in the process chamber that is sufficient to remove water. In some embodiments, the HF dosing is performed at a pressure that is sufficient to remove water. In some embodiments, water removal includes both raising the temperature and lowering the pressure to remove the water.

In some embodiments water may be removed from the surface using electromagnetic irradiation (e.g., UV irradiation or microwave irradiation), plasma treatment (i.e. electron, ion, and radical exposure) as well as electron beam treatment. The irradiation, plasma and electron beam treatment energy is selected such as not to cause any damage to the surface of the substrate, and not to interfere with the isotropic nature of the etch. Therefore, relatively low-energy electrons, such as electrons with energy of between about 5-10 eV, are used in some embodiments for the electron (plasma or electron beam) treatment.

Figure 2D:
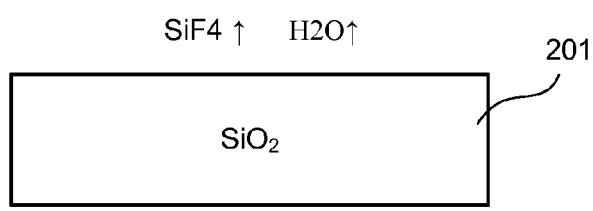

The timing of water removal can vary. Removal of water can be performed concurrently with HF treatment, may overlap with HF treatment for a portion of time, or may be performed after HF treatment. It is important to note that if the removal of water is performed in the beginning of HF treatment, then the selected water removal method should not completely deactivate the surface of silicon oxide to HF etching. Thus, in some embodiments removal of water is performed under such conditions that do not result in desorption of alcohol or carboxylic acid from the surface of silicon oxide. The silicon tetrafluoride generated during the etching reaction is a volatile compound that typically is removed from the surface of the substrate with the water or before water is removed, as shown in FIG. 2D. Germanium tetrafluoride formed during etching of germanium oxide is similarly removed.

It can be seen that in the processed substrate shown in FIG. 2D, a controlled amount of silicon oxide has been removed. The amount of removed silicon oxide is determined by the amount of surface modification (e.g., amount of adsorbed alcohol) in the first hydroxylation step and/or by the amount of HF dosed onto the substrate. Importantly, control is achieved by not allowing excess of active hydrogen containing species and HF to be present simultaneously in the process chamber. Thus, when alcohol or carboxylic acid is dosed to the process chamber, HF is not supplied to the process chamber. Similarly, when HF is supplied to the process chamber, alcohol or a carboxylic acid is only present on the surface of the substrate and is not supplied to the process chamber. Removal of water further contributes to atomic-scale control of the reaction. Typically one etching cycle removes between about 0.5-10 atomic layers of oxide, such as between about 1-5 atomic layers. In one implementation about 10 Å of silicon oxide is removed in one cycle of etching.

Next, in operation 109, it is decided if further etching is required in order to etch a target thickness of silicon oxide. If the amount removed in the first cycle of etching is sufficient, then the etching is complete. The process chamber is purged and/or evacuated if any reaction products or HF remains in the chamber. Optionally the etching sequence is completed in 111 by contacting the substrate with an alcohol to remove any surface-bound fluoride.

If, in operation 109 it is determined that further etching is needed to etch a target thickness of silicon oxide, the sequence of operations is repeated. Typically, the process chamber is purged or evacuated to remove reaction byproducts and excess HF (if present), and the surface of the substrate is again contacted with an active hydrogen-containing species, followed by removal of non-surface-bound active hydrogen containing species, and followed by HF treatment and water removal. The process can be performed for as many cycles as needed. In some embodiments at least two cycles are performed, such as between about 2-10 cycles. It is noted that the active hydrogen containing species used in the repeating cycles may be the same or different in different cycles. For example, in some embodiments in the first cycle water may be used as the active hydrogen-containing species, while in the following cycles an alcohol may be employed.

In some embodiments it is preferable to remove water during the etching reaction, as it is generated in the reaction. This embodiment is illustrated by the process diagram shown in FIG. 3. In operation 301, the substrate is contacted with an active hydrogen-containing species (e.g., alcohol, carboxylic acid, hydrogen-containing species generated in a plasma) to modify the surface of the silicon oxide. After modification (e.g., chemisorption of alcohol), the non-surface-bound active hydrogen-containing species is removed from the process chamber, e.g., by purging or evacuation in operation 303, and HF is then provided to contact the substrate in operation 305 and conditions are maintained to remove water as it is generated in the etching reaction. For example, the temperature of the substrate during HF treatment may be sufficiently high, such that adsorption of water to the surface of the silicon oxide is impossible, or such as to cause quick desorption of water. In other embodiments, the pressure and temperature are maintained such that the water desorption rate is sufficiently high to remove water from the surface. In yet other embodiments, the substrate is irradiated, e.g., with UV radiation, microwave radiation, or treated with plasma or electron beam that is sufficient to desorb water or prevent it from adsorbing, while the substrate is treated with HF. The advantage of removing water in situ as it is generated in the etching reaction, is that water would not further catalyze the etching reaction. Therefore in this embodiment less control on the amount of added HF is required. In some embodiments it is even possible to add HF in large excess, and still achieve atomic-scale control over the amount of etched silicon oxide, if water is efficiently and timely removed during the reaction. Next, after the reaction is complete, the process chamber is typically purged or evacuated to remove excess HF (if present) and the reaction products. If it is determined in operation 307 that further etching is required, the cycle is repeated. When no further etching is required, the substrate may be optionally treated with an alcohol to remove surface-bound fluoride.

Figure 3:
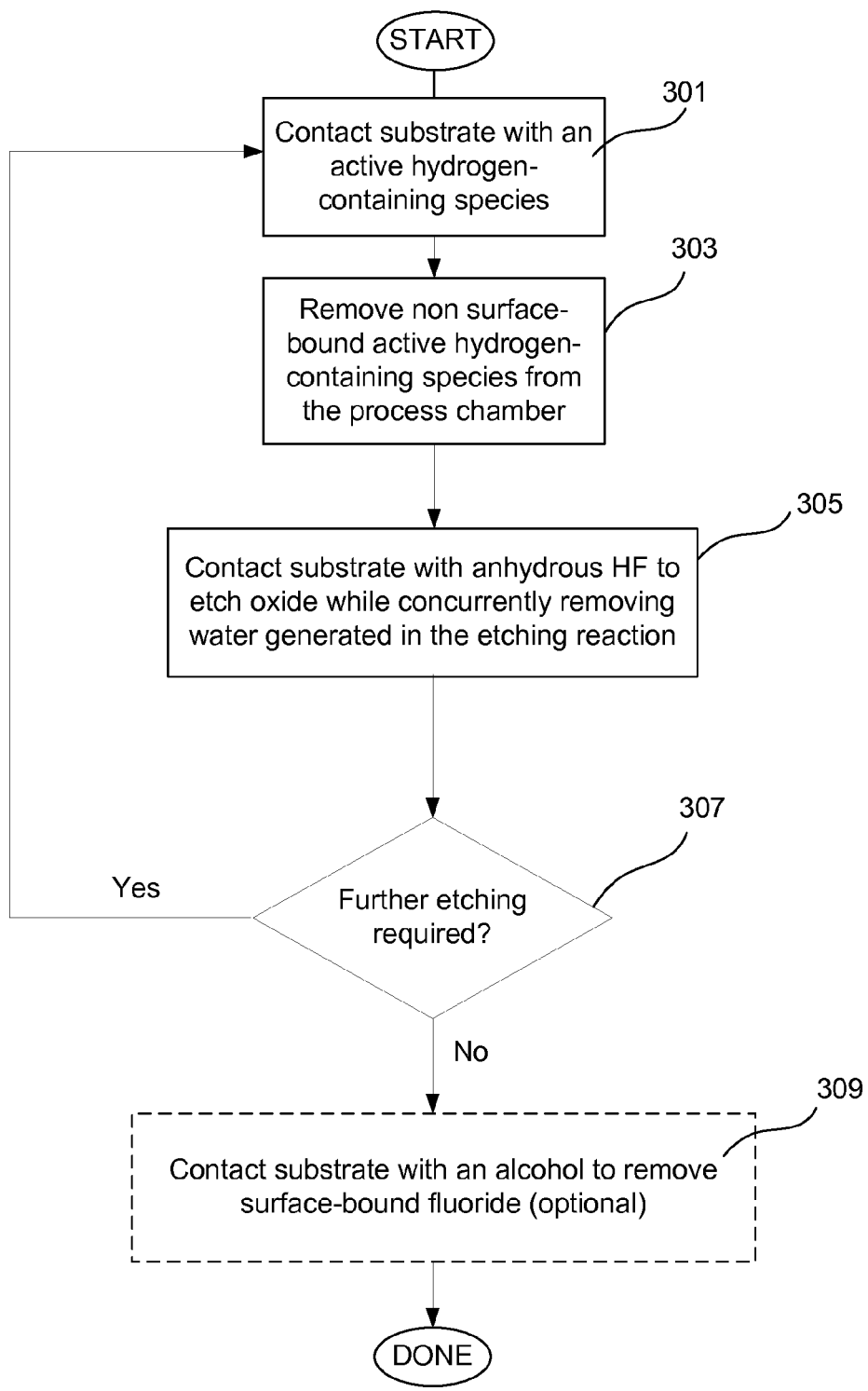
FIG. 3 is a process flow diagram for an etching method in accordance with an embodiment provided herein.

The processes shown in FIG. 1 and FIG. 3 can be modified with a variety of pre-treatments and post-treatments to condition the surface of the substrate. In some embodiments, prior to operation 101, the substrate is treated with dry HF to remove silanol bonds on the surface of the silicon oxide. The process chamber is then purged or evacuated to remove HF. Other pretreatments may include a plasma process or wet clean process to remove surface contaminants such as hydrocarbons or hydro-fluorocarbons.

Figure 4:
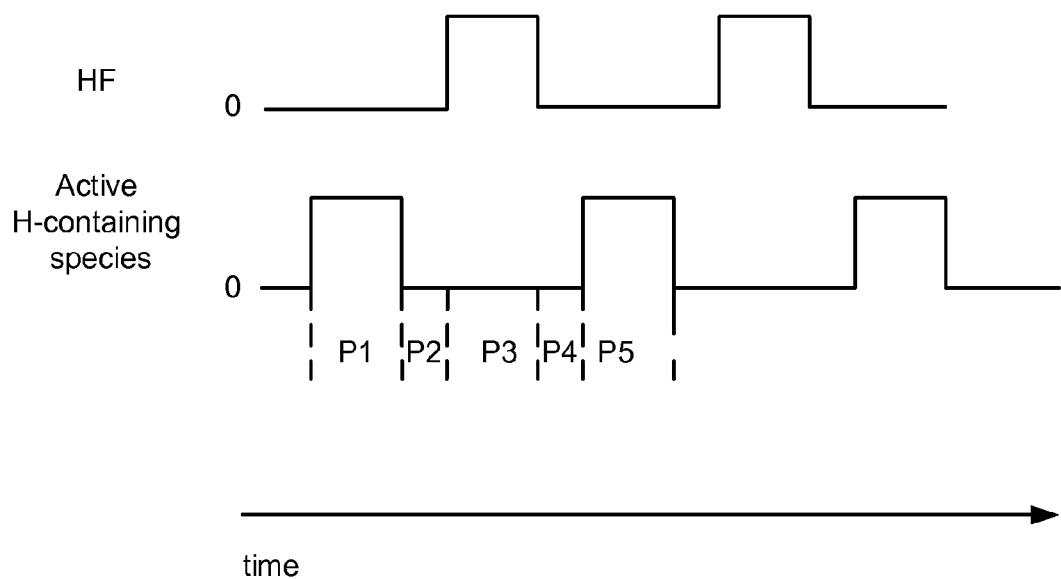
FIG. 4 is a timing diagram illustrating dosing of reagents during etching in accordance with an embodiment presented herein.

FIG. 4 illustrates a timing diagram showing the dosing of reagents for the processes shown in FIG. 1 and FIG. 3. In a first period, P1, the active hydrogen-containing species is supplied to the process chamber in an absence of HF. In some embodiments, an alcohol, or a carboxylic acid is flowed into the reaction chamber during P1 and is allowed to chemisorb on the surface of the substrate. In other embodiments active hydrogen-containing species formed from a hydrogen-containing plasma contacts the substrate during the period P1. Next, in period P2, neither the active hydrogen-containing species, nor HF is admitted into the chamber. During this period, the active hydrogen-containing species that is not bound to the surface of the substrate is removed from the process chamber. This can be accomplished with, for example, purging the process chamber with an inert gas (e.g., $N_2$, Ar, He, Ne, and combinations thereof) and/or evacuation. Next, in period P3, anhydrous HF is flowed into the process chamber in an absence of an active hydrogen-containing species (such as alcohol), and is allowed to react with the modified surface of the substrate. Next, in period P4, neither the HF nor the active hydrogen-containing species is flowing into the process chamber, and the process chamber may be purged or evacuated to remove non surface-bound HF and/or reaction products in the process chamber. Water removal can be performed in various embodiments, concurrently with HF dosing (during the entire step of HF dosing), during a second portion of HF dosing, after the HF dosing is completed, and using combinations of these. The described sequence completes one cycle of etching, which can controllably and isotropically etch between about 0.5-10 atomic layers of silicon oxide on the surface of a substrate. Next, if further etching is needed, the process is repeated by dosing the active hydrogen-containing species in period P5, and so on. In some embodiments, removal of water generated in the previous cycle is performed, at least in part, during the first portion or during the entirety of the period of treatment with the active hydrogen species of the next cycle. For example, in some embodiments, surface-bound water generated in the first etching cycle is removed during period P4 or during first portion of period P5.

The process conditions, such as temperature and pressure for each of the steps of the etching cycle will depend on the nature of the active hydrogen-containing species, the type of water removal method, and the timing of water removal, and can be varied within the guidelines provided herein. In most examples the temperature ranges from between about 20 to about 300° C., and the pressure ranges between about 100 mTorr to about 760 torr. Examples shown below illustrate several different embodiments of the provided etching methods.

Example 1

In this implementation, the entire etching cycle is performed at a sufficiently high temperature that does not allow water to stay adsorbed as it is generated in the etching reaction. In some embodiments, the etching process is performed at a temperature of at least about 80° C., such as between about 80° C.-300° C., e.g., between about 100° C.-300° C. The advantage of this method is that the temperature can be kept substantially constant during the entire etching cycle. Furthermore, because water is removed as it is generated during the etching reaction, the HF can be added in this embodiment in excess because the reaction will be limited by the amount of active hydrogen-containing species on the modified surface of the oxide after the first hydroxylation step. This embodiment, however, is not limited to using excess quantity of HF, and in some implementations, a controlled, limited amount of HF is dosed.

In one specific implementation of this example, the process makes use of alcohols or carboxylic acids that have a vapor pressure that is lower or is not substantially higher (i.e. not more than 200% higher) than the vapor pressure of water. These compounds are capable of adsorbing or staying adsorbed to the substrate while water is being desorbed. Examples of these compounds include n-butanol, tert-butanol, ethylene glycol, propylene glycol, and n-propanol. In the first period, P1, such compound or a mixture of such compounds is flowed into the process chamber and is allowed to adsorb on the surface of the substrate, while the temperature of the substrate is above the water desorption point. Then, the flow of the compound is stopped, and in period P2 the process chamber is purged or evacuated without substantially changing the temperature. Next, in P3 anhydrous HF is flowed into the process chamber, again without changing the temperature, is allowed to react with the modified surface of the oxide, while water generated in this reaction is removed from the surface as it is being generated, because the temperature is sufficiently high. Next, after the reaction is complete, in period P4 the process chamber is purged and/or evacuated. If needed, the cycle can be repeated. In one example, n-butanol or tert-butanol is introduced into the process chamber together with $N_2$, at a temperature of about 100° C. and a pressure of about 100 Torr, and is allowed to chemisorb on the substrate. Next the flow of butanol is stopped and the process chamber is purged with $N_2$. Next, anhydrous HF is introduced into the process chamber without changing the temperature and is allowed to react with the surface layer of modified silicon oxide. The process chamber is then purged with $N_2$ and the process is optionally repeated 1-3 times.

In another specific implementation of Example 1, the surface of the oxide is modified by contacting it with a hydrogen-containing species formed from a hydrogen-containing plasma. In period P1 the substrate is contacted with a direct plasma (plasma generated in the same process chamber that houses the substrate) or a remote plasma (plasma generated in a different chamber) containing active hydrogen-containing species to form OH bonds on the surface of silicon oxide on the substrate. A variety of plasmas can be used. Typically the plasma is generated from a gas comprising a hydrogen-containing gas (e.g., $H_2$, ammonia, hydrazine, water, hydrogen fluoride, hydrogen chloride, silane, disilane, methane, ethane, butane and combinations thereof) with an optional presence of a second gas (e.g., oxygen, nitrous oxide, nitric oxide, carbon dioxide, carbon monoxide, water vapor and combinations thereof). The gas may also include an inert gas, such as He, Ar, Ne and combinations thereof in addition to the hydrogen-containing gas. After the plasma treatment, the plasma generation or flow of plasma-generated species into the chamber is stopped in period P2 and the plasma-generated species quickly decay in the chamber. Next, anhydrous HF is flowed into the process chamber at a temperature and pressure that are sufficient to remove water from the surface of the substrate, as it is generated during the reaction with the activated surface of the oxide.

Example 2

In this implementation water is removed from the surface of the substrate by electromagnetic irradiation (e.g., UV irradiation), by plasma treatment (e.g., by electrons, radicals and ions formed in a plasma) or by electron beam treatment. The water is removed from the substrate surface as it is generated in the reaction. The advantage of this implementation is that radiation-independent heating of the substrate is not necessary. Further, in this implementation, the choice of the active hydrogen-containing species that can modify the surface of oxide is more extensive than in Example 1. Similarly to Example 1, HF can be flowed in excess, because water is removed during the reaction, and the amount of removed oxide is determined by the amount of modified oxide in the first step. In this implementation the active hydrogen-containing species (water, an alcohol, a carboxylic acid, or a species generated in hydrogen plasma) contacts the substrate in period P1 and modifies the surface of the oxide. The temperature and pressure in this step are selected such that the adsorption or other modification can occur. Because this embodiment does not rely on heating for water removal, lower alcohols, such as methanol and ethanol, can be used and can be adsorbed at relatively low temperatures, such as between about 10° C.-80° C. Next, in period P2, the process chamber is purged and/or evacuated, or, the hydrogen-containing species generated in a plasma are allowed to decay. In period P3 the anhydrous HF is introduced while water is concurrently removed from the wafer by irradiation, plasma treatment, or electron beam treatment.

Example 3

In this embodiment water is removed from the surface of the substrate by raising the temperature to a temperature that is sufficient to desorb water and/or by lowering the pressure to achieve the conditions that desorb water from the substrate surface.

For example, the substrate may be treated with an active hydrogen-containing species at a first temperature. At some point after treatment with the active hydrogen-containing species, the temperature is raised to a second temperature that is sufficient to desorb water from the surface of the substrate. For example, if the active species is the species generated from a hydrogen-containing plasma, or if the active species is an alcohol or a carboxylic acid that has a vapor pressure that is lower or that is not significantly higher than the vapor pressure of water and the second temperature does not cause dehydroxylation of the surface of the substrate, the temperature may be raised as early as immediately after treatment with the active hydrogen-containing species, during removal of the non-surface-bound active hydrogen species, or concurrently with HF introduction. If an alcohol with a vapor pressure that is significantly higher than water is used, such as methanol, and therefore at the second temperature methanol would desorb, it is more advantageous to delay raising the temperature until HF has been introduced and the reaction has started. For example, the temperature may be raised during the second half of the HF introduction period. In some embodiments temperature is raised after the HF flow has stopped. In some embodiments, temperature is raised, or high temperature is maintained during a first portion of period P5 (e.g., during introduction of methanol in the second cycle of etching). Next, the temperature is lowered for the rest of the period P5.

In one example, methanol is flowed to the process chamber during period P1 and is allowed to chemisorb at a first temperature, e.g. at about 30° C. Next, the process chamber is purged in period P2 to remove non surface-bound methanol, and HF is flowed into the process chamber in period P3. Preferably in this embodiment a controlled limited amount of HF is introduced, where the amount of HF is limited to the amount that is necessary to etch a desired thin controlled layer of silicon oxide (such as between about 0.5-10 atomic layers). The reaction may be allowed to proceed for some time, and then the temperature is raised to a temperature that causes the desorption of water, such as to about 100° C. In some embodiments the temperature is raised during the period P2, while HF is flowed into the process chamber. In other embodiments, the temperature is raised after the flow of HF is stopped (e.g., during a first portion of period P5).

Example 4

In this implementation methanol and/or a ketone (e.g., acetone) are used to facilitate removal of water from the surface of the substrate. In this example, any active hydrogen-containing species can be used in the process, but the etching sequence is structured such as to remove water concurrently with methanol and/or a ketone (such as acetone), because removal of water is facilitated in their presence. Methanol and/or ketone can be introduced at any suitable stage before or during water removal. For example in one specific example, the surface of the substrate is hydroxylated by an active hydrogen-containing species; next the process chamber is purged or evacuated, followed by introduction of controlled amount of HF. During the introduction of the HF or after the reaction is completed, methanol and/or ketone is flowed into the process chamber and conditions are adjusted for water removal (e.g., temperature is raised and/or pressure is lowered). In some embodiments, the temperature may remain the same throughout the process and is selected such as not to cause desorption of water, but to cause desorption of water/methanol mixture and/or water/ketone mixture.

Example 5

Alternative Embodiment

While in the embodiments that were previously described, the process started with the hydroxylation of silicon oxide surface on the substrate, in an alternative embodiment, the process may start with adsorption of anhydrous HF onto the surface of the substrate. Next, after HF has adsorbed, non-surface-bound HF is removed from the process chamber (e.g., by purging and/or evacuation), and the substrate is contacted with an active hydrogen-containing species. Any active hydrogen-containing species described herein may be used. The adsorbed HF would react with the silicon oxide surface in a presence of the active hydrogen-containing species and the amount of etched material will be limited by the amount of HF adsorbed on the surface. Water is removed from the process chamber as it was described for the previous embodiments. Water may be removed as it is being generated during the etching reaction (during introduction of the active hydrogen-containing species), or after the reaction is completed.

Apparatus

The methods described herein can be practiced in a variety of apparatuses that are equipped with delivery lines and control mechanisms configured for sequential delivery of gaseous reagents. Examples of suitable process chambers include plasma etch, isotropic etch, and chemical vapor deposition process chambers, as well as resist strip chambers. To prevent damage from the use of corrosive HF, the apparatus may include HF-resistant materials at least for the parts that are in direct contact with HF. For example, in some embodiments, the process chamber is coated with an HF-resistant polymer, such as a copolymer of ethylene and chlorotrifluoroethylene known as Halar®. In some embodiments, the chamber is anodized or nickel plated. The delivery lines delivering the HF, in some embodiments are made of nickel.

The suitable apparatus includes a process chamber having a substrate support for holding the substrate in position during etching, an inlet for introduction of the reagents, an outlet that is typically connected with a pump for evacuating the process chamber, and a controller having program instructions for performing any of the steps of the provided methods. In some embodiments the apparatus is equipped with a heater and/or a cooler configured to heat or cool the substrate, as desired. The heater and/or cooler may be integrated into the substrate support. In some embodiments, the heating of the substrate may be implemented with the use of lamps positioned above the substrate, where the lamps radiate heat onto the substrate. The lamps may be used as the main method of heating or in addition to the substrate holder heating. In some embodiments the substrate holder includes a motor and is configured to rotate the substrate during processing. In those embodiments where direct plasma is used in the process chamber (either for generation of active hydrogen-containing species from hydrogen-containing plasma or for treatment of the substrate during water removal), the apparatus is equipped with an RF or microwave plasma generator. In those embodiments, where remote plasma is used (either for generation of active hydrogen-containing species from hydrogen-containing plasma or for treatment of the substrate during water removal) the apparatus includes a separate chamber in which the remote plasma is generated using a RF or microwave plasma generator. The remote plasma chamber is connected through a feed conduit to the process chamber housing the substrate and is configured to deliver species generated in the remote plasma to the surface of the substrate. In those embodiments, where electromagnetic radiation, such as UV irradiation and/or microwave irradiation are used to remove water from the surface of the substrate the apparatus will also include a source of electromagnetic radiation, such as a UV lamp, or a microwave generator. These sources are typically separated from the substrate by a window that can transmit the specific type of electromagnetic radiation in use. For example, an HF-resistant, UV-transmitting window, such as sapphire-coated quartz or bulk quartz window may replace the ceiling of the process chamber allowing transmission of UV radiation from a UV lamp positioned over the window.

Figure 5:
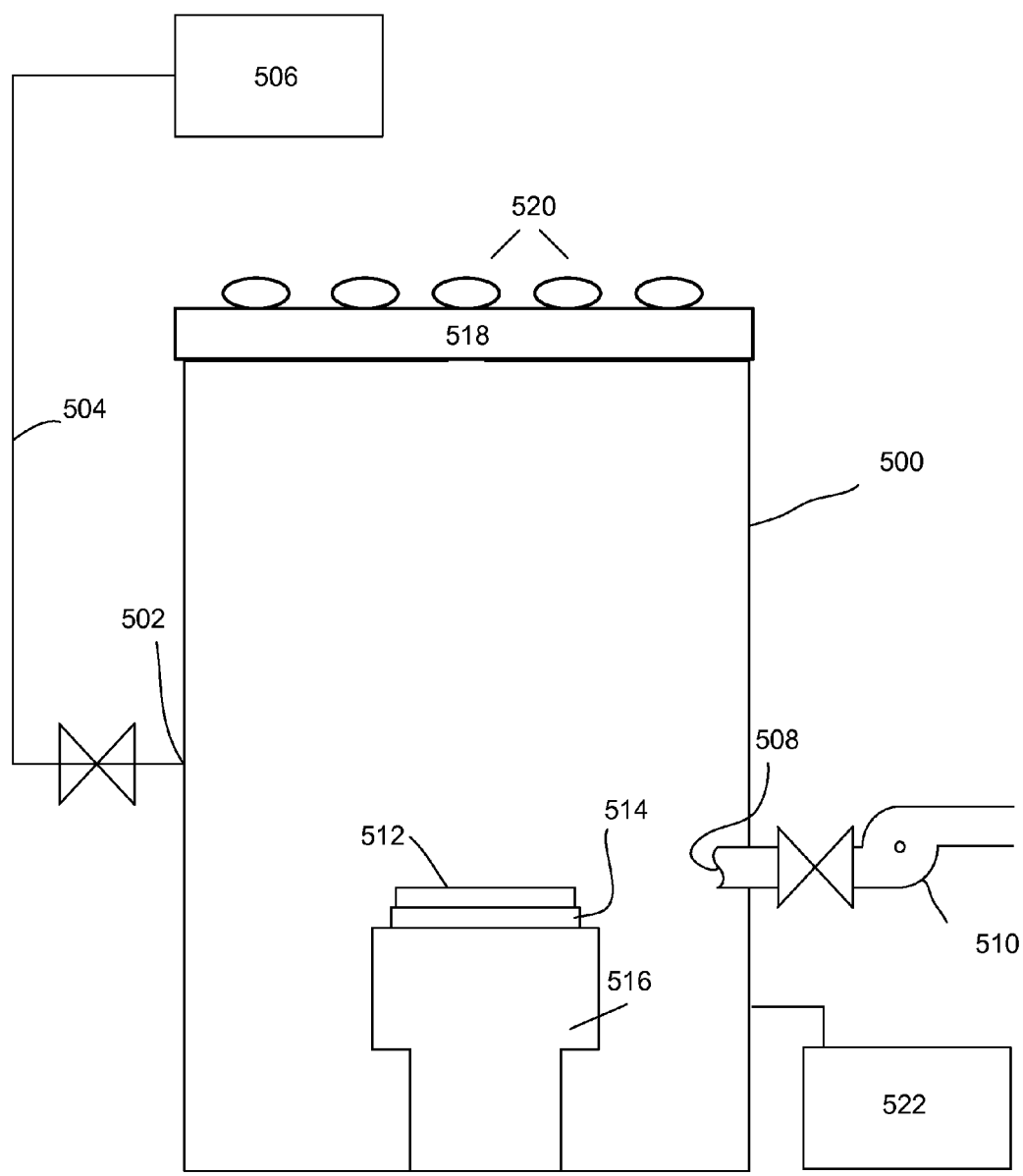
FIG. 5 is a schematic presentation of an apparatus suitable for performing etching reactions provided herein, in accordance with one embodiment.

A schematic presentation of an example of a process chamber suitable for implementing etching methods provided herein is shown in FIG. 5. The process chamber 500 includes an inlet 502 for introduction of gaseous reagents, where the inlet is coupled with a shut-off valve or a flow control valve. A delivery line 504 connects a source of reagents 506 to the inlet 502. In some embodiments, the delivery line 504 may include a plurality of individual lines, e.g., an anhydrous HF line, and an alcohol delivery line. In some embodiments the delivery lines are connected with a source of heat and are heated during the delivery of reagents in order to prevent condensation of reagents within the lines. The source of reagents includes a source of anhydrous HF and, if alcohol or a carboxylic acid is used, a source of alcohol or carboxylic acid. The source of reagents may also include sources of inert gases for purging the process chamber, and sources of hydrogen-containing gas for formation of hydrogen-containing plasma. The delivery system, containing the delivery lines will also typically include one or more flow meters that are used for accurate measurement of doses of reagents admitted into the process chamber. The process chamber also has an outlet 508 connected with an outlet valve and a pump 510. Excess reagents, reaction products and purging gases exit the chamber through the outlet when the outlet valve is open. The pressure in the process chamber can be accurately controlled by controlling the flow rates of the reagents and by pumping out the excess gases from the process chamber.

The substrate 512 is secured on the substrate holder pedestal 516, which further includes a thermoelectric chuck 514, configured to heat the substrate. In the illustrated embodiment, the ceiling of the process chamber is an optional transparent or translucent window 518, which separates the process chamber from UV lamps 520 that are used to irradiate the substrate with UV light and remove water from the surface of the substrate. In other embodiments IR lamps that can emit radiative heat are positioned over the ceiling of the process chamber, and are used to heat the surface of the substrate. In some embodiments, the apparatus may include both a UV lamp and an IR lamp or other source of heat above the substrate. A controller 522 is electrically connected to the apparatus and is used to control all stages of the etching process. The controller 522 includes program instructions or built-in logic to perform the etching methods in accordance with any of the embodiments described herein. For example the controller may include the code specifying the timing of delivery of reagents, the temperature and pressure during each stage of the etching cycle, and parameters associated with substrate irradiation.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers. The various systems may be used in one fabrication facility with the ALE chamber or module described above.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of controllably etching an oxide layer on a substrate, the method comprising:
    (a) contacting the substrate housed in a process chamber with an active hydrogen-containing species to modify the surface of the oxide on the substrate, wherein the active hydrogen-containing species is a compound containing one or more OH groups, or a hydrogen-containing species generated in a hydrogen plasma, wherein the oxide is selected from the group consisting of silicon oxide, germanium oxide, and combinations thereof, and wherein the contacting of the substrate with the active hydrogen-containing species is performed without flowing HF into the process chamber;
    (b) removing non surface-bound active hydrogen species from the process chamber after the surface of the oxide is modified;
    (c) flowing an anhydrous HF into the process chamber after (b) without flowing an active hydrogen-containing species into the process chamber, wherein the anhydrous HF reacts with the modified surface of the oxide and wherein the reaction generates water;
    (d) removing the water generated in (c) from the surface of the substrate.

2. The method of claim 1, wherein (c) and (d) are concurrent, and are performed at a temperature and pressure that do not permit water to stay adsorbed to the substrate surface as water is generated in the reaction.

3. The method of claim 1, wherein the active hydrogen-containing species is an alcohol that is capable of adsorbing or staying adsorbed to the surface of the oxide under conditions when water is desorbed from the surface of oxide.

4. The method of claim 1, wherein the active hydrogen-containing species is formed from a hydrogen-containing plasma, and wherein hydroxyl (OH) bonds are formed on the surface of the oxide by application of a hydrogen containing plasma under conditions when water is desorbed from the surface of the oxide.

5. The method of claim 4, wherein the hydrogen containing plasma is formed from a gas that comprises a hydrogen-containing gas selected from the group consisting of $H_2$, ammonia, hydrazine, water, hydrogen fluoride, hydrogen chloride, silane, disilane, methane, ethane, butane and combinations thereof.

6. The method of claim 5, wherein the hydrogen containing plasma is formed from a gas comprising the hydrogen-containing gas and a second gas selected from the group consisting of water vapor, oxygen, nitrous oxide, nitric oxide, carbon dioxide, carbon monoxide and combinations thereof.

7. The method of claim 1, wherein the active hydrogen-containing species is selected from the group consisting of a propanol, a butanol, butoxyethanol, butanediol, ethylene glycol, methylene glycol, propylene glycol, amyl alcohol, a carboxylic acid, and combinations thereof.

8. The method of claim 1, wherein the active hydrogen-containing species is a butanol.

9. The method of claim 8, wherein (c) and (d) are performed concurrently, and wherein water is being removed as it is generated in the reaction.

10. The method of claim 1, wherein the active hydrogen-containing species is selected from the group consisting of methanol, ethanol, propanol, butanol, butoxyethanol, ethylene glycol, methylene glycol, propylene glycol, amyl alcohol and combinations thereof, wherein the operations (a)-(d) are performed at the same temperature, and wherein water is being removed from the surface of oxide as it is generated in the reaction.

11. The method of claim 1, wherein the active hydrogen-containing species is characterized by a saturated vapor pressure that is lower or is substantially the same as the saturated vapor pressure of water for selected conditions, wherein the operations (a)-(d) are performed at the same temperature, and wherein water is being removed from the surface of oxide as it is generated in the reaction.

12. The method of claim 11, wherein the flow of the anhydrous HF into the process chamber is ceased before (d).

13. The method of claim 1, wherein the active hydrogen-containing species is selected from the group consisting of methanol, ethanol, water and a water-alcohol azeotrope that adsorbs to the surface of oxide in (a), and wherein the anhydrous HF is provided in (c) in a controlled, limited amount.

14. The method of claim 1, wherein the active hydrogen-containing species is methanol or ethanol that adsorbs to the surface of oxide in (a) at a first temperature, and wherein the water is removed in (d) by raising the temperature of the substrate to a second temperature that is higher than the first temperature.

15. The method of claim 1, wherein (d) comprises removing water by a method selected from the group consisting of: (i) raising the temperature of the substrate, (ii) lowering pressure in the process chamber, (iii) treating the substrate with a plasma, (iv) treating the substrate with an electron beam, (v) irradiating the substrate with the electromagnetic radiation, and combinations thereof.

16. The method of claim 1, wherein operations (a)-(d) remove 0.5-10 atomic layers of oxide from the substrate.

17. The method of claim 1, comprising performing at least 2 cycles comprising operations (a)-(d).

18. The method of claim 1, wherein operations (a)-(d) are performed at a single temperature of at least about 80° C.

19. The method of claim 1, further comprising:
applying photoresist to the substrate;
exposing the photoresist to light;
patterning the photoresist and transferring the pattern to the substrate;
and selectively removing the photoresist from the substrate.

20. A method of controllably etching an oxide layer on a substrate, the method comprising:
(a) contacting the substrate housed in a process chamber with an anhydrous HF without flowing an active hydrogen-containing species into the process chamber to adsorb a layer of HF on the oxide layer on the substrate, wherein the oxide is selected from the group consisting of silicon oxide, germanium oxide, and combinations thereof;
(b) removing non surface-bound HF from the process chamber after the HF has adsorbed;
(c) after removal of the non surface-bound HF, contacting the substrate with the active hydrogen-containing species without flowing HF into the process chamber, to react with the HF on the substrate, wherein the active hydrogen-containing species is a compound containing one or more OH groups, or a hydrogen-containing species generated in a hydrogen plasma, and, wherein the reaction generates water;
(d) removing the water generated in (c) from the surface of the substrate.

* * * * *